(12) United States Patent
Kanou et al.

(10) Patent No.: US 6,930,532 B2
(45) Date of Patent: Aug. 16, 2005

(54) EXPONENTIAL CONVERSION CIRCUIT AND VARIABLE GAIN CIRCUIT

(75) Inventors: Nobuo Kanou, Tokyo (JP); Takafumi Yamaji, Yokohama (JP); Tetsuro Itakura, Tokyo (JP)

(73) Assignee: Kabushiki Kaisha Toshiba (JP)

(*) Notice: Subject to any disclaimer, the term of this patent is extended or adjusted under 35 U.S.C. 154(b) by 0 days.

(21) Appl. No.: 10/826,813

(22) Filed: Apr. 15, 2004

(65) Prior Publication Data

US 2004/0196088 A1 Oct. 7, 2004

Related U.S. Application Data

(62) Division of application No. 09/952,639, filed on Sep. 13, 2001, now Pat. No. 6,777,999.

(30) Foreign Application Priority Data

Sep. 14, 2000 (JP) .......................................... 2000-280829

(51) Int. Cl.[7] ............................................. G06F 7/556
(52) U.S. Cl. ......................... 327/346; 327/359; 327/563
(58) Field of Search ................................ 327/346–349, 327/351, 355, 356, 358, 359, 560–563, 65–67, 74–75; 708/277, 851; 330/254, 278, 285

(56) References Cited

U.S. PATENT DOCUMENTS

| 4,816,772 A | * | 3/1989 | Klotz ........................... 330/254 |
| 5,278,518 A | | 1/1994 | Debroux ...................... 530/279 |
| 5,481,218 A | | 1/1996 | Nordholt et al. ............. 327/350 |
| 5,867,777 A | | 2/1999 | Yamaji et al. ............ 455/234.1 |
| 5,909,136 A | * | 6/1999 | Kimura ........................ 327/356 |
| 6,215,989 B1 | | 4/2001 | Otaka ....................... 455/234.1 |
| 6,369,618 B1 | * | 4/2002 | Bloodworth et al. ........ 327/346 |
| 6,563,383 B1 | * | 5/2003 | Otaka et al. ................. 330/254 |
| 6,777,999 B2 | * | 8/2004 | Kanou et al. ................ 327/346 |

FOREIGN PATENT DOCUMENTS

JP 11-88093 3/1999

* cited by examiner

*Primary Examiner*—Long Nguyen
(74) *Attorney, Agent, or Firm*—DLA Piper Rudnick Gray Cary US LLP

(57) ABSTRACT

In a master block, the exponential conversion characteristic is determined on the basis of a common mode reference voltage and a reference voltage. In a slave block, the exponential conversion characteristic determined with the master block is used to create a control voltage and a gain control signal on the basis of a common mode reference voltage and a reference voltage. For example, a gain of the variable gain amplifier is controlled by using this gain control signal.

6 Claims, 11 Drawing Sheets

EXPONENTIAL CONVERSION CIRCUIT AND VARIABLE GAIN CIRCUIT

CROSS-REFERENCE TO RELATED APPLICATION

This application is a divisional application of U.S. patent application Ser. No. 09/952,639 filed on Sep. 13, 2001 now U.S. Pat. No. 6,777,999, which is based on and claims the benefit from prior Japanese Patent Application No. P2000-280829 filed on Sep. 14, 2000, the disclosures of both are incorporated herein by reference.

BACKGROUND

The present invention relates to an exponential conversion circuit having a function of exponentially changing a gain of a variable gain amplifier on the basis of a gain control signal.

In recent years, mobile communication devices represented by a portable phone or the like are briskly developed. It is important that these mobile communication devices are small in size and light in weight because these devices are based on a presupposition that the devices can be carried by a user.

Consequently, at present, it rarely happens that these mobile communication devices comprise a combination of a plurality of individual components (functions). The mobile communication devices comprise ASIC's mixedly providing the plurality of functions. As a consequence, size reduction and weight reduction of the mobile communication devices are realized.

By the way, such mobile communication devices naturally have a sending and receiving circuit for sending and receiving electronic waves for the exchange of information by wire (electric waves). In the IF (intermediate frequency) portion of the sending and receiving circuit, a variable gain amplifier is arranged, and this variable gain amplifier has a function of adjusting an IF signal to an appropriate level.

For example, there is available a code division multiple access (CDMA) method as one of the mobile communication methods. In the CDMA method, the control of the sent electric power in a mobile station becomes indispensable, a wide scope gain control of 70 dB or more is demanded for the variable gain amplifier used in the IF portion.

Generally, in order to perform such wide scope gain control with the variable gain amplifier, it is necessary to exponentially adjust a signal level with respect to the gain control signal. Furthermore, in order to facilitate the gain control, it becomes important that the relation between the control input signal and the decibel display output signal has a linear configuration over a wide scope.

Furthermore, portable phones are based on a presupposition that the phones are carried by a user. Consequently, it is desired that the gain of the variable gain amplifier used therein has a small dependency on a temperature change resulting from a change in the environment in which the phones are used. Furthermore, a gain error must be suppressed which is caused by a disparity in a threshold value of a MOS transistor resulting from a manufacturing process of an integrated circuit.

However, for example, the constant maintenance of the characteristic for exponentially changing the gain of the variable gain amplifier with respect to the gain control signal, and the change of the decibel display output signal with respect to the control input signal become very difficult for the following reasons.

In the beginning, the variable gain amplifier will be explained.

As shown in FIG. 1, a variable gain amplifier and a gain control circuit thereof comprise a MOS transistor (CMOS circuit).

Here, the MOS transistor is generally used in the double characteristic area (strong inversion area) but can be used in a sub threshold area (weak inversion area). In this case, an exponential operation is conducted and the transmission characteristic can be approximately described in the following manner.

$$I_D = kx\frac{W}{L}\exp\frac{V_{GS}}{nV_T} \quad (1)$$

Incidentally, in the expression (1), symbol $I_D$ denotes a drain current of a MOS transistor, symbol $W$ denotes a channel width of the MOS transistor, symbol $L$ denotes a channel length of the MOS transistor, symbol $V_{GS}$ denotes a voltage between the gate and the source of the MOS transistor, and symbol $V_T$ denotes a thermal voltage. Symbol n is a constant. Furthermore, symbol $K_x$ has a value associated with a conductance of the MOS transistor. Symbol Kx depends on the manufacturing process of the integrated circuit together with the constant n.

By the way, in FIG. 1, a variable gain amplifier 702 can vary the gain with a bias current Ibias. Furthermore, the bias current Ibias becomes equal to a drain current $I_D$ of a MOS transistor M701 with the current mirror circuits M702 and M703 inside of a gain control circuit 701.

On the other, when the MOS transistor M701 in the variable gain control circuit 701 is allowed to be operated in a weak inversion area to give a gain control signal Vc to a gate of the MOS transistor M701, the drain current $I_D$ of the MOS transistor M701 changes exponentially with the change in the gain control circuit Vc.

That is, as a consequence, the gain of the variable gain amplifier 702 changes exponentially with the change of the gain control signal Vc.

However, the following problem is generated in order to directly use the characteristic of the expression (1) in the circuit of FIG. 1.

That is, when logarithm on both sides of the equation (1) is taken, the following equation is provided.

$$\log I_D = \log kx + \log\frac{W}{L} + \left(\frac{1}{nV_T}\right)V_{GS} \quad (2)$$

Here, as described above, in expression (2), symbol $K_x$ is affected by the influence of the manufacturing process of the integrated circuit, the transmission characteristic (expression (2)) of the MOS transistor, namely, the exponential conversion characteristic changes with the manufacturing process, specifically, a disparity in the thickness and the processing generated at the time of the manufacturing process.

Furthermore, a third item on the right side of the expression (2) determines the exponential conversion characteristic (characteristic of the exponential correlation). However, with respect to a heat voltage $V_T$, in order to maintain the temperature dependency, the exponential conversion characteristic also changes depending on the temperature change in the case where a temperature change is generated in the MOS transistors M 701, M 702 and M 703 in the gain control circuit. As a consequence, the variable scope (gain characteristic) of the gain of the variable gain amplifier 702 changes.

Incidentally, in the gain control circuit 701 of FIG. 1, even when a bipolar transistor is used instead of the MOS transistor 701, the exponential conversion characteristic (characteristic of the exponential correlation) comes to have a temperature dependency for the same reasons as described above.

Consequently, in the case where the exponential conversion characteristic of an active device is directly used in the variable gain amplifier 702, an error is generated in the exponential conversion characteristic resulting from a change in the environment (temperature change) and a manufacturing process of the integrated circuit so that a desired exponential conversion characteristic cannot be obtained.

Furthermore, with respect to the variable gain amplifier 702 used in a wireless receiver, it is important to linearly change a decibel display output signal with respect to the control input signal. Furthermore, it is required that the temperature dependency of the exponential conversion circuit is small, and the exponential conversion characteristic is not affected by the characteristic change of the active device resulting from the manufacturing process of the integrated circuit.

In this manner, in the case where exponential operation (characteristic) of the active device (MOS transistor) is directly used in the control of the variable gain amplifier 702, the variable gain amplifier 702 cannot maintain at a constant level a variable scope (gain characteristic) of the gain of the variable gain amplifier 702 with respect to the variable scope of the gain control signal Vc because of the change of the temperature environment of the active device, the characteristic change of the active device due to the manufacturing process of the integrated circuit, or the like.

From this, it is demanded that the gain is exponentially changed with respect to the gain control signal, that is, the relation between the change in the gain control signal and change in the gain which is a decibel display is linear from the viewpoint of facilitation of the control in the case where the gain is controlled in the wireless communication device. Furthermore, in such a case, it is demanded that the change ratio of the gain characteristic with respect to the temperature is definite, and the gain characteristic does not change with the characteristic change of the active device resulting from the manufacturing process of the integrated circuit with the result that the realization of the gain control circuit for realizing these demands is desired.

As described above, in the conventional variable gain amplifier and the gain control circuit for controlling the gain, there is a problem that the variable scope (gain characteristic) of the gain in the variable gain amplifier with respect to the variable scope of the gain control signal cannot be maintained on a definite level because the gain characteristic of the variable gain amplifier changes resulting from the characteristic change of the active device and the temperature change.

SUMMARY

An exponential conversion circuit according to the aspect of the present invention comprises:

a first voltage conversion circuit for converting first and second reference voltages to first and second differential output voltages;

a first exponential conversion device for creating a first output current which changes exponentially with respect to the first differential output voltage;

a second exponential conversion device for creating a second output current which changes exponentially with respect to the second differential output voltage;

a current comparison circuit for changing the first gain control signal in accordance with a ratio of the first and the second output currents;

a second voltage conversion circuit for converting a control input voltage and a first reference input voltage into third and fourth differential output voltages, respectively, on the basis of a first gain control signal; and a third conversion device for creating a third output current which changes exponentially with respect to the third and the fourth differential output voltages.

DETAILED DESCRIPTION

Figure 1:
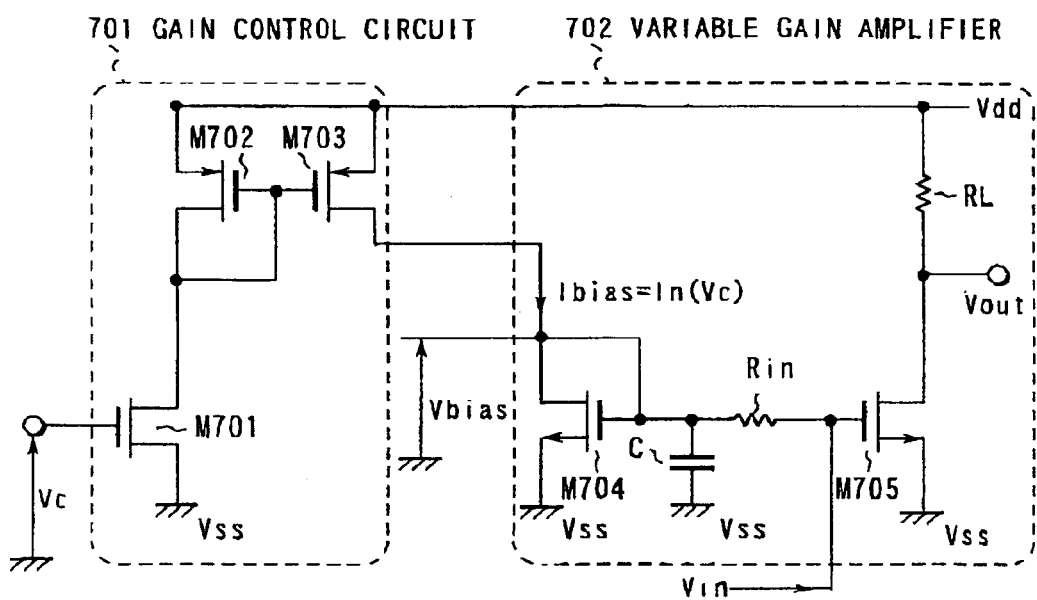
FIG. 1 is a diagram showing one embodiment of a conventional exponential conversion circuit and a variable gain amplifier.

Hereinafter, referring to the drawings, there will be explained in detail an exponential conversion circuit and a variable gain circuit using the exponential conversion circuit according to the present invention.

It is assumed that in the exponential conversion circuit and the variable gain circuit of the present invention, a voltage conversion circuit is an ideal linear circuit. However, when a voltage conversion circuit with a variable magnification ratio is constituted by using a normal MOS transistor or a bipolar transistor, the input and output characteristic shows a weak linearity. It is possible to assume that the voltage conversion circuit conducts a linear operation with no attention to the non-linearity. However, there is a case in which a demand on the linearity is very strict in the system. In such a case, the correction of the linearity is required.

Here, in the input and output characteristic of the exponential conversion circuit, an output signal of a decibel display is denoted by Y, a common-mode feedback amount is set to Y0, a ratio of a voltage conversion circuit is denoted by G, an input signal is denoted by X, an equation of Y=Y0+G·X is provided in the case where the output signal Y and the input signal X are in a linear relation. However, Y0 and G are constants which are determined with a device value of a device constituting a circuit form and a circuit.

Furthermore, the above input and output relation equation can be obtained by using a bipolar transistor and a weak inversion area of the MOS transistor. However, Y0 and G changes with the temperature, and becomes a value different from the value at the time of measurement with the change in the manufacturing process.

In the exponential conversion circuit, the temperature dependency of Y0 and G can be made small. At the same time, the influence by the manufacturing process of Y0 and G can be alleviated. In particular, the exponential conversion circuit of the present invention makes the magnification rate G of the voltage conversion circuit variable with the control signal Z. The exponential conversion circuit comprises a master exponential conversion circuit including a feedback circuit and a slave exponential conversion circuit for actually conducting the exponential conversion.

In such a structure, the voltage conversion circuit can vary the gain (magnification rate). However, it is very difficult to secure a wide input signal range while maintaining the variable scope on a wide level. As a consequence, the ratio G depends not only upon the control signal Z but also upon the input signal X, and the ratio G changes. In this case, a relational expression Y=Y0+G(X, Z)·X can be obtained. Here, G(X, Z) means that the ratio G can be represented with the function of X and Z.

By the way, when the control signal Z is given so as to eliminate the change of the magnification ratio G with respect to the change of the input signal X, an exponential conversion circuit can be realized in which the ratio G becomes ostensibly definite. Here, suppose that Z for setting the ratio G to a definite level is represented in a linear expression, an expression of Z=A+B·Z can be obtained. Then, the target exponential conversion operation (calculation of constants A and B) is conducted with two master exponential conversion circuits, a linear expression circuit to which the input signal X is input for outputting an output signal Z (=A+B·Z) and a slave exponential conversion circuit for actually conducting the exponential conversion of the X.

Furthermore, suppose that Z for setting the ratio G to a definite level is represented in a second-order linear expression, an expression of $Z=A+B·Z+CX^2$ can be obtained. Then, an operation of the target exponential conversion (calculation of constants A, B and C) is conducted with three master conversion circuits, and a second order liner expression circuit to which an input signal input for outputting an output signal Z $(=A+B-X+C-X^2)$ and a slave conversion circuit for actually conducting X exponential conversion circuit.

In this manner in the case where it is required that Z is formed into a polynomial expression in order to set G (X, Z) to a definite level, the master exponential conversion circuit is provided in a number larger than the degree of the polynomial expression. As a consequence, the exponential conversion operation is realized with the polynomial conversion circuit in which the polynomial expression is determined on the basis of the output signal of the master exponential conversion circuit and the slave exponential conversion circuit which is controlled with the signal converted with this polynomial circuit.

In the exponential conversion circuit of the present invention, the first exponential conversion circuit determines the second exponential conversion characteristic of the second exponential conversion circuit. That is, when the control input signal is exponentially converted to a second gain control signal on the basis of the second exponential conversion characteristic, the second gain control signal ceases to be affected by the characteristic change and the temperature change of the active device or the like with respect to the control input signal.

Consequently, a second gain control signal output from the exponential conversion circuit of the present invention is used, for example, as a control signal of the variable gain circuit (variable gain amplifier), the gain control which does not depend on the characteristic change and the temperature change of the active device or the like can be realized.

Figure 2:
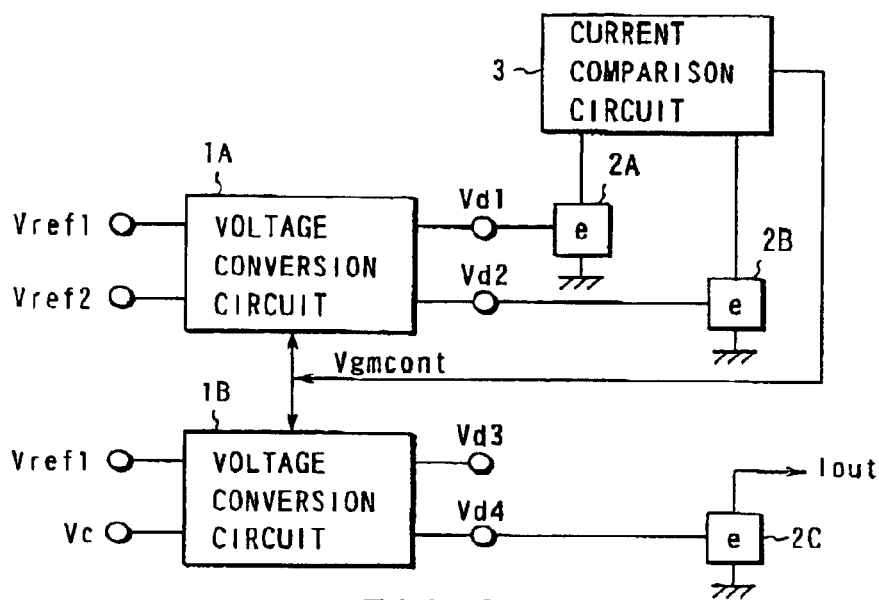
FIG. 2 is a diagram showing an exponential conversion circuit according to a first embodiment of the present invention.

FIG. 2 is a diagram showing an exponential conversion circuit according to a first embodiment of the present invention.

Two reference input voltages Verf1 and Verf2 are input to the voltage conversion circuit 1A. The voltage conversion circuit 1A converts the reference input voltages Verf1 and Verf2 to differential output voltages Vd1 and Vd2 on the basis of the magnification ratio determined with a gain control signal Vgmcont.

An exponential conversion device 2A creates an output current which changes exponentially with respect to the differential output voltage Vd1 while the exponential conversion device 2B creates an output current which changes exponentially with respect to the differential output voltage Vd2. These output currents are input to a current comparison circuit 3. The current comparison circuit 3 changes the values of the gain control signal Vgmcont in accordance with the ratio of the output current of the exponential conversion devices 2A and 2B.

Furthermore, the reference input voltage Verf1 and the control input voltage Vc are input to the voltage conversion circuit 1B. The voltage conversion circuit 1B converts the reference input voltage Verf1 and control input voltage Vc to differential output voltages Vd3 and Vd4 on the basis of the ratio which is determined with the gain control signal Vgmcont.

An exponential conversion circuit 2C creates an output current Iout which changes exponentially with respect to the differential Output voltage Vd1. An output current Iout changes exponentially with respect to the change in a control input voltage Vc.

Figure 3:
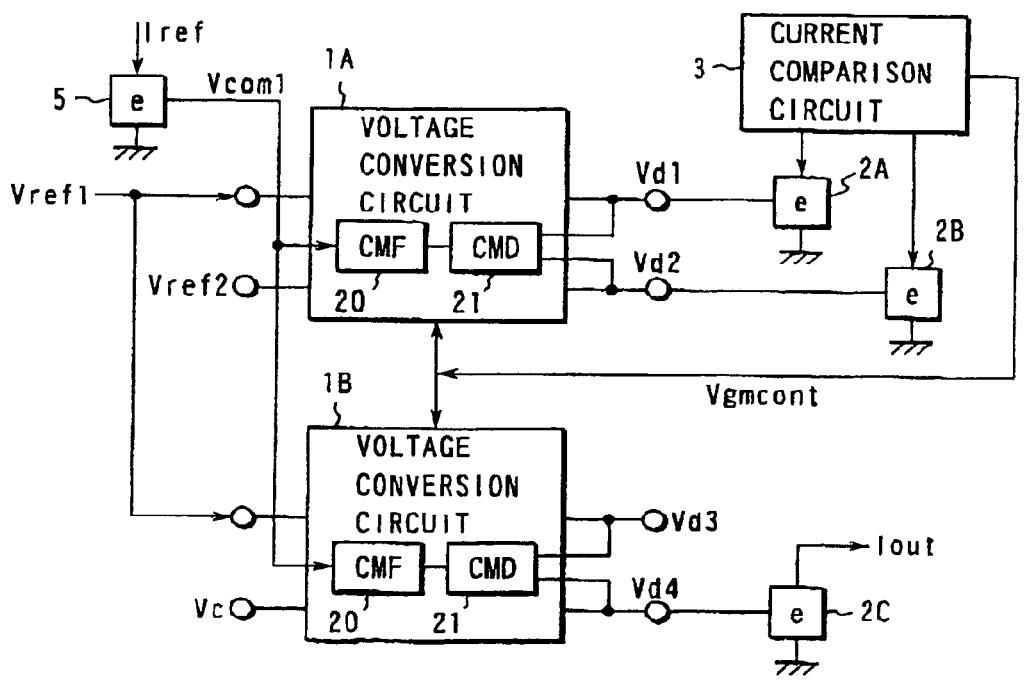
FIG. 3 is a diagram showing an exponential conversion circuit according to a second embodiment of the present invention.

FIG. 3 is a diagram showing an exponential conversion circuit according to a second embodiment of the present invention.

The exponential conversion circuit of the present invention is characterized in that the voltage conversion circuits 1A and 1B have a common-mode detection circuit (CMD) 21 and a common-mode feedback circuit (CFM) 20.

Two reference input voltages Verf1 and Verf2 are input to the voltage conversion circuit 1A. The voltage conversion circuit 1A has a common-mode detection circuit 21 and the common-mode feedback circuit 20. Furthermore, the logarithm conversion device 5 creates a reference voltage Vcom1 which becomes a logarithm of the reference input current Iref having a temperature characteristic. This reference voltage Vcom1 is given to the common-mode feedback circuit 20. Then, the voltage conversion circuit 1A converts the reference input voltages Verf1 and vref2 into differential output voltages Vd1 and Vd2 on the basis of the ratio determined with the gain control signal Vgmcont.

The exponential conversion device 2A creates an output current which changes exponentially with respect to the differential output voltage Vd1 while the exponential conversion device 2B creates an output current which changes exponentially with respect to the differential output voltage Vd2. These output currents are input to the current comparison circuit 3. The current comparison circuit 3 changes the value of the gain control signal Vgmcont in accordance with the ratio of the output current of the exponential conversion devices 2A and 2B.

Furthermore, the reference input voltage Verf1 and the control input voltage Vc are input to the voltage conversion circuits 1B. The voltage conversion circuit 1B has a common-mode detection circuit 21 and a common-mode feedback circuit 20. Furthermore, the logarithm conversion circuit 5 creates a reference voltage Vcom1 which becomes a logarithm of the reference input current Iref having a temperature characteristic. This reference voltage Vcom1 is given to the common-mode feedback circuit 20. Then, the voltage conversion circuit 1B converts the reference input voltage Verf1 and the control input voltage Vc to differential output voltages Vd3 and Vd4 on the basis of the ratio determined with the gain control signal Vgmcont.

The exponential conversion circuit 2C creates the output voltage Iout which changes exponentially with respect to the differential output voltage Vd1 out of the two out voltages of the voltage conversion circuits 1B in this embodiment. The output current Iout changes exponentially with respect to the change in the control input voltage Vc.

Incidentally, the exponential conversion devices 2A, 2B and 2C can comprise, for example, electric field effect transistors (MOSFET's) which are operated in a weak inversion region. Furthermore, the exponential conversion devices 2A, 2B and 2C can also comprise bipolar transistors instead of the electric field effect transistor.

Figure 4:
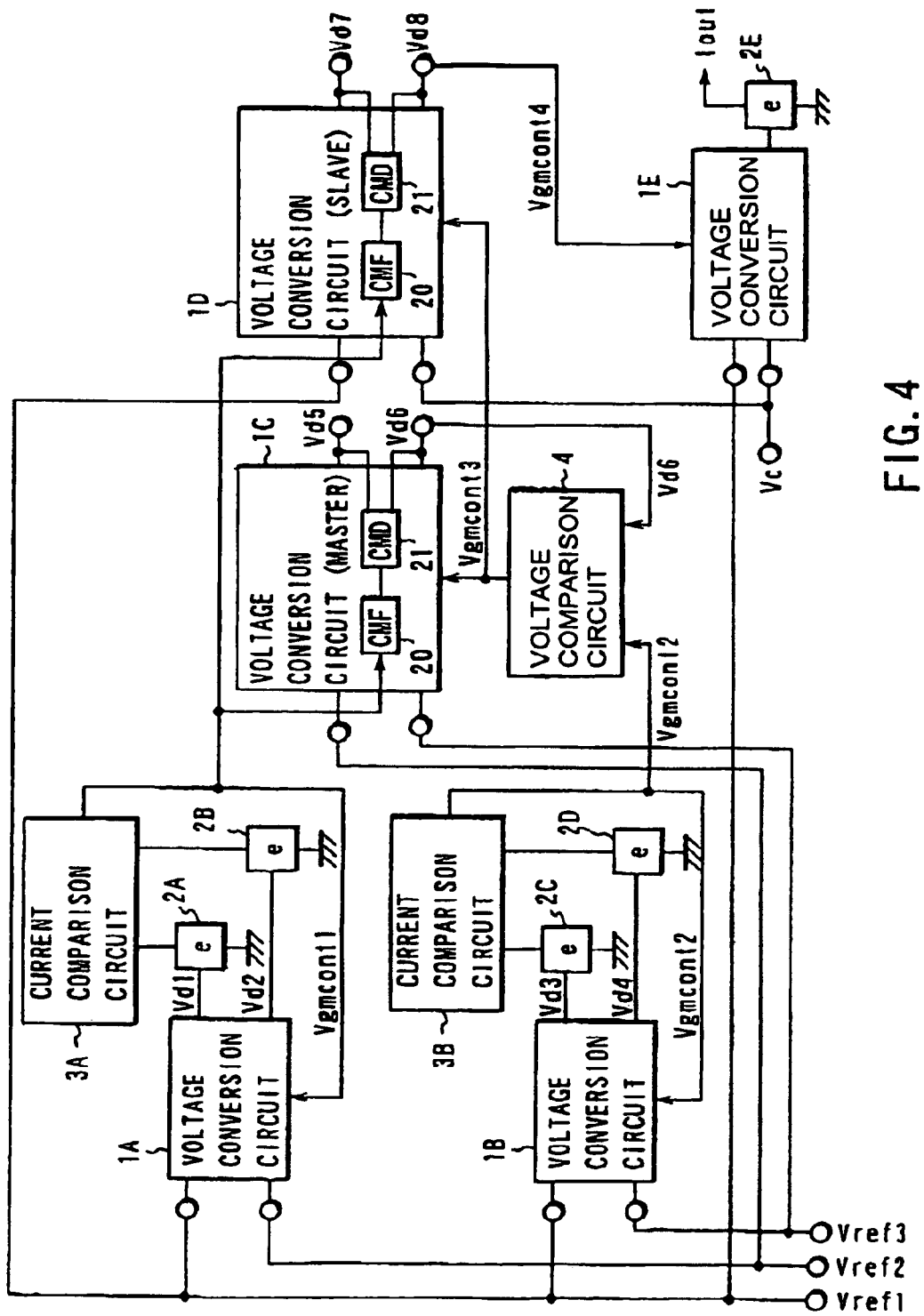
FIG. 4 is a diagram showing an exponential conversion circuit according to a third embodiment of the present invention.

FIG. 4 shows an exponential conversion circuit according to a third embodiment of the present invention.

Two reference input voltages Verf1 and Verf2 are input to the voltage conversion circuit 1A. The voltage conversion circuit 1A has a common-mode detection circuit and a common-mode feedback circuit in the same manner as FIG. 3. The voltage conversion circuit 1A converts the reference input voltages Vref1 and Verf2 to the differential output voltages Vd1, Vd2 on the basis of the ratio determined with the gain control circuit Vgmcont1.

The exponential conversion device 2A creates the output current which changes exponentially with respect the differential output voltage Vd1 while the exponential conversion device 2B creates the output current which changes exponentially with the differential output voltage Vd2. These output currents are input to the current comparison circuit 3A. The current comparison circuit 3A changes the value of a gain control signal Vgmcont1 in accordance with the ratio of the output current of the exponential conversion devices 2A and 2B.

Two reference input voltages Vref1 and Vref3 are input to the voltage conversion circuit 1B. The voltage conversion circuit 1B has a common-mode detection circuit and a common-mode feedback circuit in the same manner as FIG. 3. The voltage conversion circuit 1B converts the reference input voltages Vref1 and Verf2 to differential output voltages Vd3 and Vd4 on the basis of the ratio determined with a gain control signal Vgmcont2.

The exponential conversion device 2C creates an output current which changes exponentially with respect to the differential output voltage Vd3. The exponential conversion device 2D creates an output current which changes exponentially with respect to the differential output voltage Vd4. These output currents are input to the current comparison circuit 3B. The current comparison circuit 3B changes the value of the gain control signal Vgmcont2 in accordance with the ratio of the output current of the exponential conversion device 2C and 2D.

Two reference input voltages Verf2 and Vref3 are input to the voltage conversion circuit 1C. The voltage conversion circuit 1C has a common-mode detection circuit (CMD) 21, and a common-mode feedback circuit (CMF) 20. The gain control signal Vgmcont1 is input to the common-mode feedback circuit 20. The voltage conversion circuit 1C converts the reference input voltages Verf2 and Vref3 to differential output voltages Vd5 and Vd6 on the basis of the ratio determined with a gain control signal Vgmcont3.

The current comparison circuit 4 creates the gain control signal Vgmcont3 in accordance with a ratio between one of the differential output voltages Vd5 and Vd6 (the differential output voltage Vd6 in this embodiment) and the gain control signal Vgmcont2.

The reference input voltage Vref1 and the control input voltage Vc are input to the voltage conversion circuit 1D. The voltage conversion circuit 1D has a common-mode detection circuit (CMD) 21 and a common-mode feedback circuit (CMF). The gain control signal Vgmcont1 is input to the common-mode feedback circuit 20. The voltage conversion circuit 1D converts the reference input voltage Vref1 and the control input voltage Vc to differential output voltages Vd7 and Vd8 5 on the basis of the ratio determined with the gain control signal Vgmcont3.

Incidentally, one of the two differential output voltages (Vd8 in this embodiment) becomes a gain control signal Vgmont4 which determines the gain (ratio) of a voltage conversion circuit 1E.

The voltage conversion circuit 1E converts the reference input voltage Verf1 and the control input voltage Vc into a differential output voltage on the basis of the ratio determined with the gain control signal Vgmcont4. An exponential conversion device 2E creates an output current Iout which changes exponentially with respect to this differential output voltage.

Incidentally, the exponential conversion devices 2A, 2B, 2C, 2D and 2E may comprise a field effect transistor (MOSFET) which is operated, for example, in the weak inversion area. Furthermore, the exponential conversion devices 2A, 2B, 2C, 2D, and 2E may comprise bipolar transistors instead of the electric field effect transistor.

Figure 5:
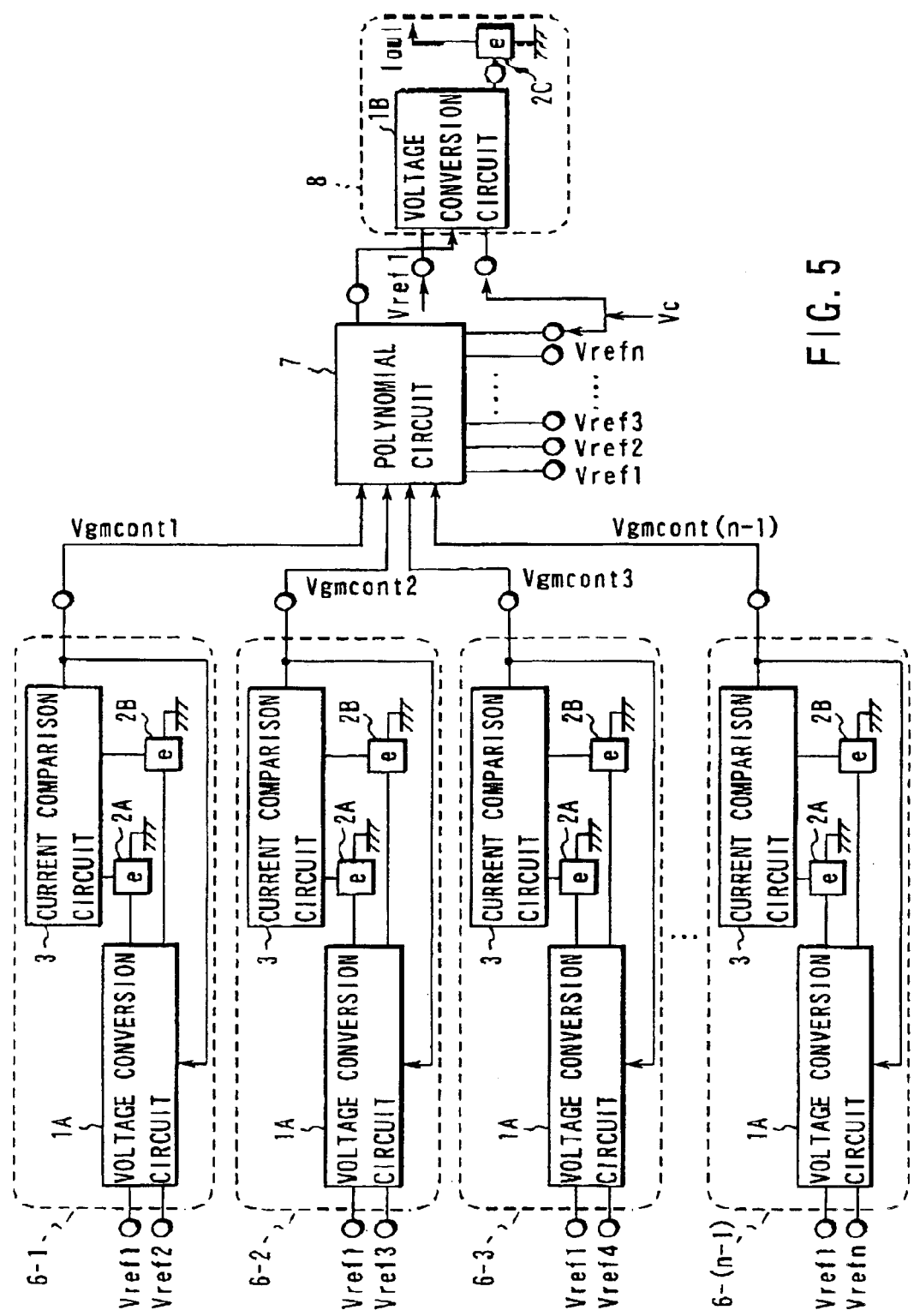
FIG. 5 is a diagram showing an exponential conversion circuit according to a fourth embodiment of the present invention.

FIG. 5 is a diagram showing an exponential conversion circuit according to a fourth embodiment of the present invention.

Each of a plurality of (n−1 in this embodiment, but n is a natural number of 3 or more) master exponential conversion circuits 6-1, 6-2, 6-3, . . . 6-(n−1) has a voltage conversion circuit 1, exponential conversion devices 2A, 2B and a current comparison circuit 3.

The voltage conversion circuit 1A in a master exponential conversion circuit 6-i (i is 1 through n−1) converts the two reference input voltages Vref1 and Verf2 to the first and the second differential output voltages on the basis of a gain control signal Vgmcont i. The exponential conversion device 2A creates a first output current which changes exponentially with respect to the first differential output voltage while the exponential conversion device 2B creates the second output current which changes exponentially with respect to the second differential output voltage. Then the current comparison circuit 3 creates the gain control signal Vgmcont i on the basis of the ratio of the first and second output currents.

The output signals Vgmcont1, Vgmcont2, Vgmcont3 . . . Vgmcont(n−1) of a plurality of master exponential conversion circuits 6-1, 6-2, 6-3, . . . 6(n−1) are input to a polynomial circuit 7. Furthermore, a plurality (n) of reference input voltages Vref1, Vref2, Vref3 . . . Vrefn and the control input voltage Vc are input to the polynomial circuit 7 and a control input voltage Vc is converted in accordance with a predetermined function.

The slave exponential conversion circuit 8 has the voltage conversion circuit 1B and the exponential conversion device 2C. The voltage conversion circuit 1B converts the reference voltage and the control input voltage Vc to a differential output voltage on the basis of the output voltage of the polynomial circuit 7. The exponential conversion device 2C creates an output current Iout which changes exponentially with respect to this differential output voltage.

Incidentally, the exponential conversion devices 2A, 2B, and 2C can comprise an electric field effect transistor (MOSFET) which operates, for example, in the weak inversion area. Furthermore, the exponential conversion circuit 2A, 2B and 2C can comprise bipolar transistors instead of the electric field transistor.

Figure 6:
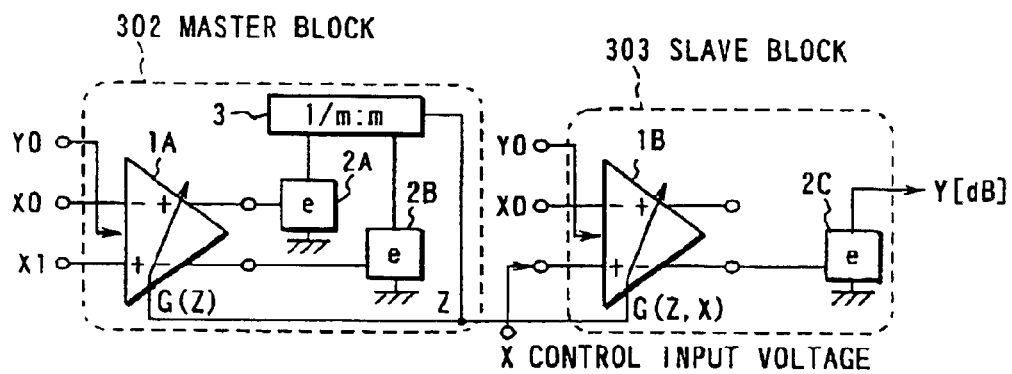
FIG. 6 is a diagram showing an exponential conversion circuit according to a fifth embodiment of the present invention.
Figure 7:
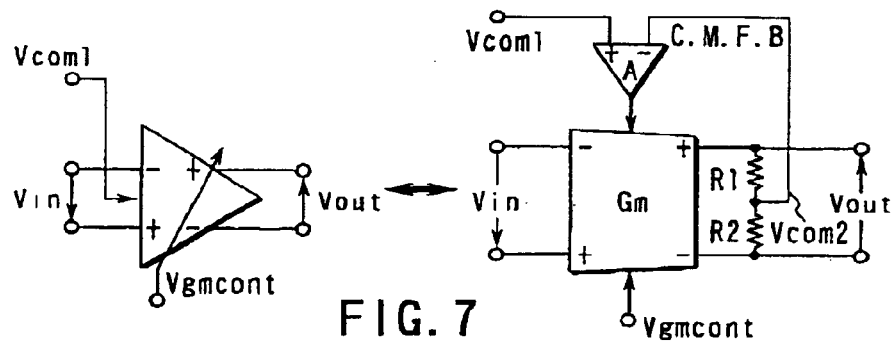
FIG. 7 is a diagram showing a concrete example of a voltage conversion circuit.

FIG. 6 is a diagram showing an exponential conversion circuit according to a fifth embodiment of the present invention. FIG. 7 is a diagram showing embodiments of the voltage conversion circuits 1A and 1B of FIG. 6.

In this exponential conversion circuit, the gain of the slave block (slave exponential conversion circuit) 303 is controlled with one master block (master exponential conversion circuit) 302.

Two reference input voltages X0 and X1 are input to the master block 302, and the value of the gain control signal (output voltage) Z is determined on the basis of a difference in these reference input voltages X0 and X1.

In the voltage conversion circuit of FIGS. 6 and 7, an output current Y displayed in decibels of the block 303 becomes as follows:

$$Y=Y0+G(Z)\cdot(X-X0)$$

This expression is converted as follows with the voltage conversion circuit 1A and the exponential conversion circuits 2A and 2B in the master block 302.

$$Y1=Y0+G(Z)\cdot(X1-X0)$$

$$Y2=Y0+G(Z)\cdot(X1-X0)$$

The current comparison circuit 3 in the master block 302 compares the output currents Y1 and Y2 output from the exponential conversion devices 2A and 2B to output a gain control signal Z. Then, this gain control signal Z determines the gain (ratio) of the voltage conversion circuits 1A and 1B.

In the master block 302, as a result of such a feedback control, the gain control signal Z and the ratio G(Z) is determined so that the ratio of the output currents Y1 and Y2 of the exponential conversion devices 2A and 2C becomes a preset value.

Figure 8:
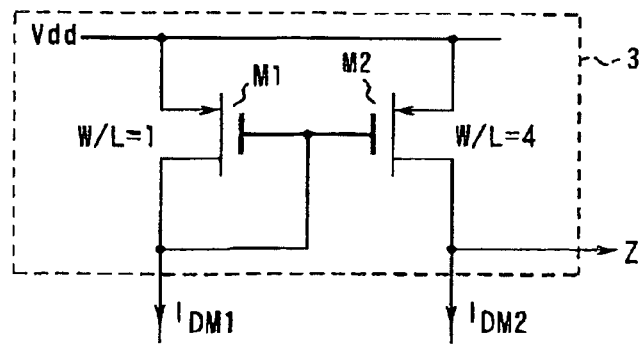
FIG. 8 is a diagram showing a concrete example of a current comparison circuit.

For example, as shown in FIG. 8, in the case where the current comparison circuit 3 comprises a current mirror circuit in which the area ratio of the MOS transistors M1 and M2 is set to 1:4("W" in W/L denotes a channel width while "L" denotes a channel length). The ratio of output currents $I_{DM1}$ and $I_{DM2}$ of the two exponential conversion devices becomes 1:4.

Since Y1 and Y2 are represented in decibel display, an expression of $Y1-Y2=2G(Z)\cdot(X1-X0)=12$ [dB] is provided.

Here, when X1−X0 is set to 0.5[V], G(Z)=12 [dB] is provided per 1[V]. Furthermore, since the gain (ratio) of the voltage conversion circuit 1B in the slave block 303 is determined with the gain control signal 2, the input and output relation in the slave block 303 will become as follows.

$$Y=Y0+12\cdot(X1-X0)$$

In this manner, in the exponential conversion circuit shown in FIGS. 6 and 7, the current comparison circuit 3 in the master block 302 determines the ratio of the output currents $I_{DM1}$ and $I_{DM2}$, so that an output change portion per unit voltage (1V) is virtually affected by the influence of the change in the environment conditions (temperature) and a disparity in the manufacturing process.

Figure 9:
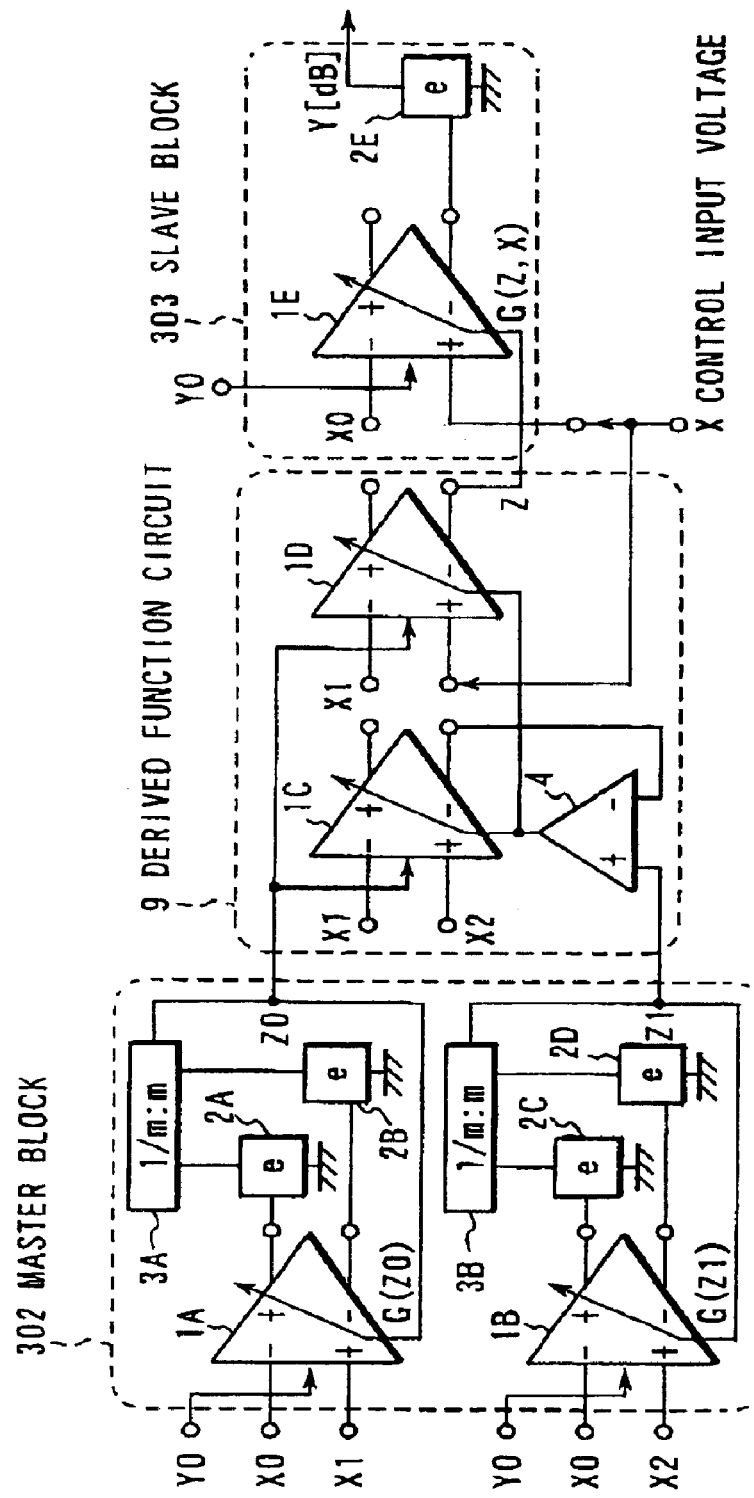
FIG. 9 is a diagram showing a certain exponential conversion circuit according to a sixth embodiment of the present invention.

FIG. 9 is a diagram showing an exponential conversion circuit according to a sixth embodiment of the present invention.

The characteristic of the exponential conversion circuit of the present invention lies in that a derived function circuit 9 is provided which has a function of correcting a non-linearity of the slave block 303 in the case where an output current Y in the decibel display of the slave block (slave exponential conversion circuit) 303 changes linearly with respect to the control input voltage X.

In the case where the change ratio G of the master block 302 and the slave block 303 changes with the control input voltage X, an expression of $Y=Y0+G(X, Z)\cdot(X-X0)$ is provided.

This non-linearity is a characteristic inconvenient for the exponential conversion circuit. Therefore, in this embodiment, Z is controlled with Z so that G(X, Z) does not ostensibly depends on X. Consequently, Y is represented with the function which changes linearly with respect to X.

In the case where the non-linearity of G(X, Z) is weak, it is supposed that Z is represented in the linear expression of X. An expression of $Z=Z0+a\cdot(X-X0)$ is provided.

In this embodiment, since unknown variants are Z0 and a, two master blocks 302 are necessary. In this case, an output current in the decibel display in each of the master block becomes as follows:

$$Y1=Y0+G(X1, Z0)\cdot(X1-X0)$$

$$Y2=Y0-G(X1, Z0)\cdot(X1-X0)$$

$$Y3=Y0+G(X2, Z1)\cdot(X2-X0)$$

$$Y4=Y0-G(X2, Z1)\cdot(X2-X0)$$

Two current comparison circuits 3A and 3B in the master block 302 outputs gain control signals Z0 and Z1 having a value which increases and decreases with the ratio of the input currents respectively. The gain (ratio) of the current conversion circuits 1A and 1B is controlled with these gain control signals Z0 and Z1.

In such feedback control, the values of Z0 and G(X0, Z0) are determined so that the ratio of the output current of the exponential conversion devices 2A and 2B becomes a preset value and the values of Z1 and G(X1, Z1) are determined so that the ratio of the output current of the exponential conversion devices 2C and 2D become a preset value.

For example, $$Y1-Y2=2G(X1, Z0)\cdot(X1-X0)=6 \text{ dB}$$

$$Y3-Y4=2G(X1, Z0)\cdot(X2-X0)=12 \text{ dB}$$

are provided.

Here, suppose that X1−X0=0.5[V], X2−X0=1.0[V] are established, G(X0−Z0)=G(X2, Z1)=6 [dB] are provided. Then, the gain control signals Z0 and Z1 are input to the derived function circuit (a linear polynomial circuit) 9 as a reference voltage.

In this derived function circuit 9, the following analog signal processing is conducted. An output voltage UI when the reference input voltage X2−X1 to the master voltage conversion circuit 1C in the derived function circuit 9 becomes as follows.

$$U1=U0+a\cdot(X2-X1)$$

U0=Z0 is established with the common-mode feedback, and a is determined so that U1=Z1 is established with the feedback of the differential mode.

$$a=(Z1-Z0)/(X2-X1)$$

At this time, the following expression is provided.

$$U = U0 + a\cdot(X - X1)$$
$$= Z0 + (Z1 - Z0)\cdot(X - X1)/(X2 - X1)$$

When U is used as a gain control signal Z of the slave block 303, Z=Z0+a·(X−X1) is provided.

When X=X1 is established, or when Z=Z0 or X=X2 is established, Z=Z1 is provided. Since the gain (ratio) of the voltage conversion circuit 1E in the slave block 303 is determined, G(X, Z) becomes a desired value, namely 6 [dB]/[V] at least in two points; X=X1 and X=X2.

In the case where the non-linearity of G(X, Z) is weak, 6 [dB]/[V] is provided in the vicinity of X0 and X1. As compared with the exponential conversion circuit of FIG. 6, a circuit error is small, and 6 [dB]/[V] can be secured over a wide scope.

Figure 10:
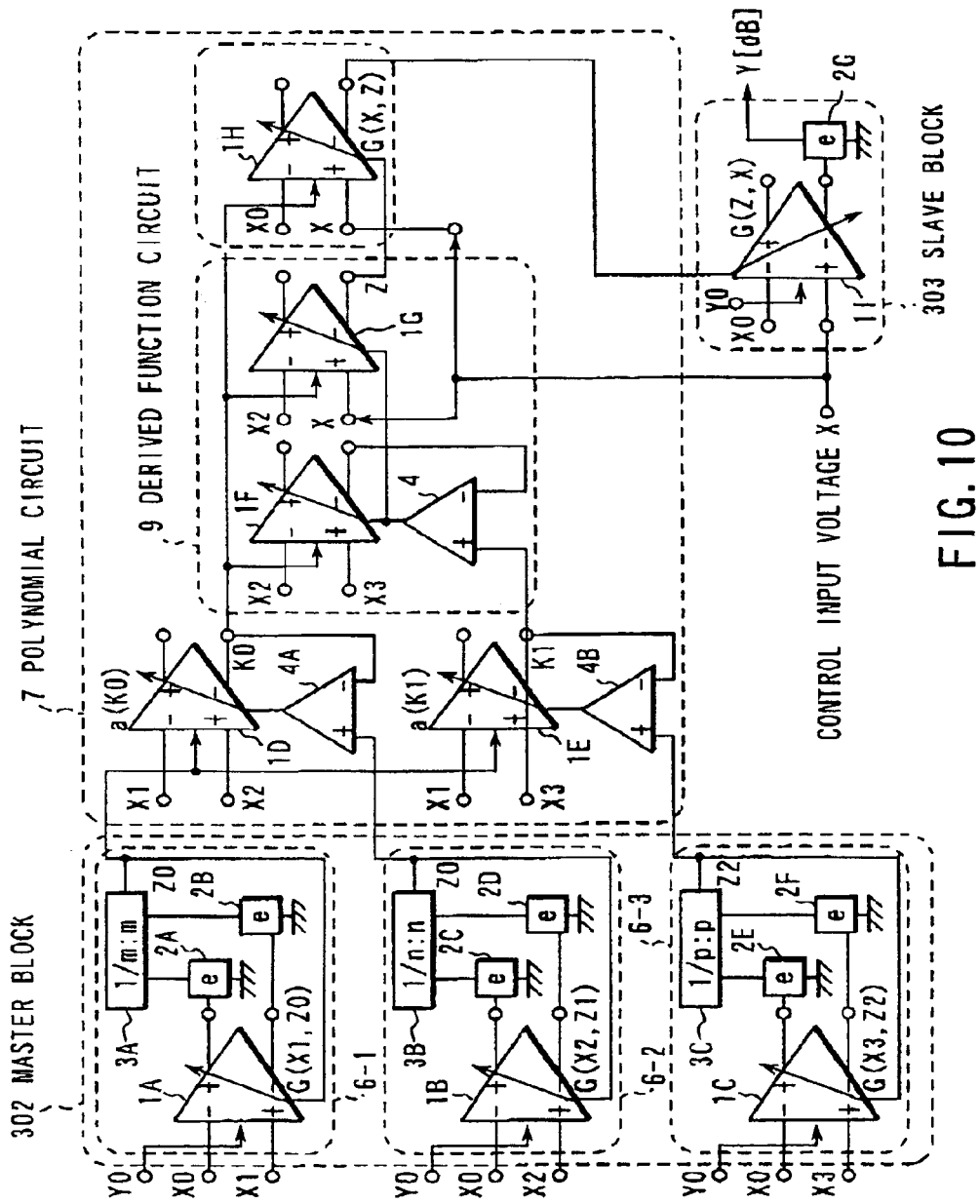
FIG. 10 is a diagram showing a certain exponential conversion circuit according to a seventh embodiment of the present invention.

FIG. 10 is a diagram showing an exponential conversion circuit according a seventh embodiment of the present invention.

In this embodiment, an output current Y in the decibel display of the slave block (slave exponential conversion circuit) has a non-linearity relation with respect to the control input voltage X, and the following result is provided.

$$Y=Y0+G(X, Z)\cdot(X-X0)$$

As a consequence, Z is controlled with X so that G(X, Z) ostensibly does not depend upon X (becomes definite with respect to X). As a consequence, the output current Y in the decibel display comes to have a linear relation with respect to the control input voltage X.

In the exponential conversion circuit of FIG. 10, since it is assumed that Z is expressed in a second-order function, the input and output relation is expressed in the following expression.

$$Z=Z0+a\cdot(X-X1)+b\cdot(X-X1)^2$$

In this embodiment, since three unknown variants Z0, a and b are provided, three master logics 302 are required. In this case, the output currents in the decibel display in each master block are as follows.

$$Y1=Y0+G(X1, Z0)\cdot(X1-X0)$$

$$Y2=Y0-G(X1, Z0)\cdot(X-X0)$$

$$Y3=Y0+G(X2, Z1)\cdot(X2-X0)$$

$$Y4=Y0-G(X2, Z1)\cdot(X2-X0)$$

$$Y5=Y0+G(X3, Z2)\cdot(X3-X0)$$

$$Y6=Y0-G(X3, Z2)\cdot(X3-X0)$$

The three current comparison circuits 3A, 3B, and 3C in the master block 302 outputs gain control signals Z0, Z1 and Z2 having a value which increases and decreases with a ratio of two input currents respectively. The gain (ratio) of the voltage conversion circuits 1A, 1B and 1C is controlled with this gain control signals Z0, Z1 and Z2.

In such feedback control, the values of Z0 and G(X1, Z0) are determined so that the ratio of the output currents of the exponential conversion devices 2A and 2B becomes a preset value, the values of Z1 and G(X2, Z1) are determined so that the ratio of the output currents of the exponential conversion devices 2C and 2D becomes a preset value, and the values of Z2 and G(X3, Z2) are determined so that the ratio of the output current of the exponential conversion devices 2E and 2F becomes a preset value.

For example, $$Y1-Y2=2G(X1, Z0)\cdot(X1-X0)=6 \text{ dB}$$

$$Y3-Y4=2G(X2, Z1)\cdot(X2-X0)=12 \text{ dB}$$

$$Y5-Y6=2G(X3, Z2)\cdot(X1-X0)=-6 \text{ dB}$$

Here, suppose that X1−X0=0.5[V], X2−X0=1.0[V], X3−X0=−0.5[V], an expression of G(X1, Z0)=G(X2, Z1) G(X3, Z2)=6 [dB] is provided. Then, this gain control signals Z0, Z1 and Z2 are input to the second order linear polynomial circuit 7.

The second order polynomial circuit 7 includes two master voltage conversion circuits 1D and 1E, a derived function circuit (linear polynomial circuit) 9 and a slave voltage conversion circuit 1H.

In the second order polynomial circuit 7, the following analog signal processing is conducted. Output signals U1 and U2 at the time of giving the reference input voltages X2−X1 and X3−X1 to the voltage conversion circuits 1D and 1E in the polynomial circuit 7 become as follows.

$$U1=U0+a(K0)\cdot(X2-X1)$$

$$U2=U0+a(K1)\cdot(X3-X1)$$

a(K0), and a(1) are determined so that U0=Z is established in the common-mode feedback and U1=Z1, U2=Z2 are established in the differential mode feedback.

$$a(K0)=(Z1-Z0)/(X2-X1)$$

$$a(K1)=(Z2-Z0)/(X3-X1)$$

In the derived function circuit (linear polynomial circuit) 9, the following analog processing is conducted. The linear polynomial circuit 9 comprises a master voltage conversion circuit 1F and a slave voltage conversion circuit 1G. When the reference voltage X3−X2 is given to the master voltage conversion circuit 1F, the following expression is given.

$$K1 = K0 + a \cdot (X3 - X2)$$

In the common mode feedback, K0 is determined, and "a" is determined so that K0 becomes K1 with the differential mode feedback.

$$a = (K1 - K0)/(X3 - X2)$$

At this time, in the slave voltage conversion circuit 1G, the following expression is provided.

$$\begin{aligned} K &= K0 + a \cdot (X - X2) \\ &= K0 + (K1 - K0) \cdot \{(X - X2)/(X3 - X2)\} \end{aligned}$$

An output signal of the linear polynomial circuit 9 is input to the slave voltage conversion circuit 1H in the second order polynomial circuit 7. An output signal U of the slave voltage conversion circuit 1H becomes as follows.

$$U = U0 + a(K) \cdot (X - X1)$$

Here, suppose that a(K) is represented in the linear expression of K.

$$\begin{aligned} a(K0) &= a(K0) + \{a(K1) - a(K0)\} \cdot (K - K0)/(K1 - K0) \\ &= a(K0) + \{a(K1) - a(K0)\} \cdot (X - X2)/(X3 - X2) \end{aligned}$$

When the common mode feedback control is conducted so that U0=Z0 is provided, U=Z0 is provided when X=X1 is established. When X=X2 is established, a(K)=a(K0) is provided. As a consequence, the following result is provided.

$$\begin{aligned} U &= U0 + a(K0) \cdot (X2 - X1) \\ &= Z0 + Z1 - Z1 = Z1 \end{aligned}$$

Furthermore, when X=X3 is established, a(K)=a(K0) is established, the following result is provided.

$$\begin{aligned} U &= U0 + a(K1) \cdot (X3 - X1) \\ &= Z0 + Z2 - Z0 = Z2 \end{aligned}$$

Thus, the target second order function is obtained.

Then, when an output signal U of this derived function circuit (linear polynomial circuit) 9 is input to the slave voltage conversion circuit 1H in the polynomial circuit (the second-order linear polynomial circuit) 7 is used as a gain control signal Z of the slave voltage conversion circuit 1H in the polynomial circuit (second order polynomial circuit) 7, a predetermined value, namely 6 [dB]/[V] is provided at least in three points, X=X1, X=X2 and X=X3.

When the non-linearity of G(X, Z) is weak, a circuit error is small and 6 [dB]/[V] is provided in the vicinity of three points (X0, X1, X2). Furthermore, as compared with the exponential conversion circuit of FIG. 6, a circuit error is small and 6 [dB]/[V] can be secured over a wide scope.

Incidentally, in the above embodiment, the second order polynomial circuit 7 is used. The present invention can be applied to the polynomial circuit having a larger order number.

Figure 11:
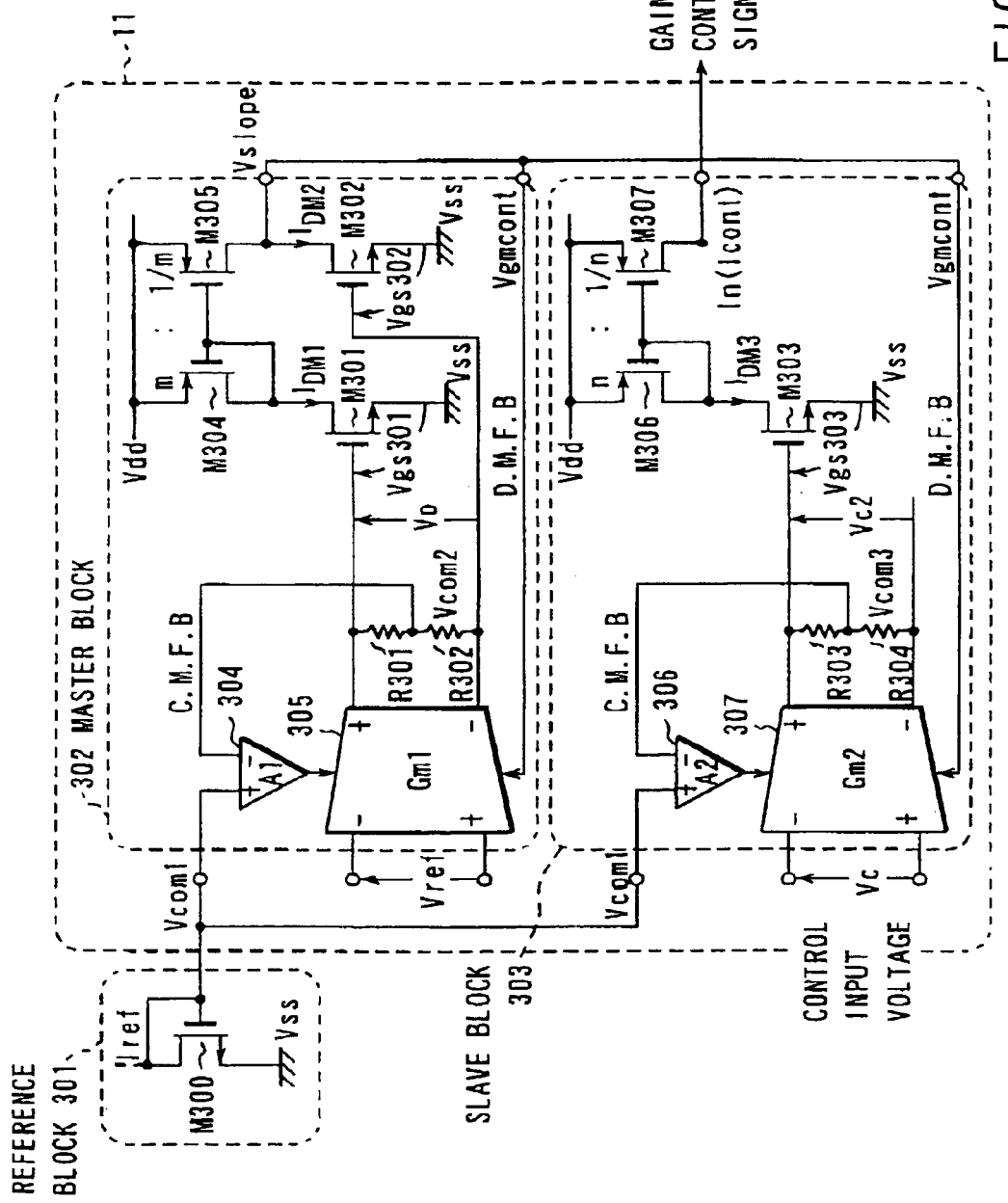
FIG. 11 is a diagram showing a certain exponential conversion circuit according to an eighth embodiment of the present invention.

FIG. 11 is a diagram showing an exponential conversion circuit according to an eighth embodiment of the present invention.

The exponential conversion circuit of the present invention comprises a reference block 301 for generating a reference voltage Vcom1, a master block 302 for determining the exponential conversion characteristic, and a slave block 303 for actually conducting the exponential conversion characteristic determined with the master block 302.

The reference block 301 comprises a MOS transistor M300. A source of the MOS transistor is connected to a ground point Vss, and the gate and the drain are mutually connected. A current Iref flows through the MOS transistor M300, and a reference voltage (common mode reference voltage) is output from the drain thereof.

The master block (first exponential conversion circuit) 302 comprises a variable trans-conductance amplifier 305, a calculation amplifier (operation amplifier) 304, a current mirror circuits M304 and M305, MOS transistors M301 and M302, and resistor devices R301 and R302.

The calculation amplifier 304 receives reference voltages Vcom1 and Vcom2 to output an output signal to the variable trans-conductance amplifier 305. The reference voltage Vcom2 is created with the resistor devices R301 and R302. The reference input voltage Vref, a conductance control signal Vgmcont and an output signal of the calculation amplifier 304 are input to the variable trans-conductance amplifier (Gm1) 305.

An output signal of the variable trans-conductance amplifier 305 is input to the gate of the MOS transistors M301 and M302. A voltage between the gate and the source of the MOS transistor M301 is Vgs 301 while a voltage between the gate and the source of the MOS transistor M302 is set to Vgs302. Furthermore, when the current $I_{DM1}$ which flows through the MOS transistor M304 is set to m, the current $I_{DM2}$ which flows through the MOS transistor M304 becomes 1/m with the current mirror circuit.

Then a control voltage (conductance control signal) Vslope which determines the exponential conversion characteristic is output from the connection point (drain) of the MOS transistors M302 and M305.

Here, on the master block 302, an input terminal of the common mode reference voltage Vcom1, an input terminal of the reference input voltage Vref, an input terminal of the conductance control signal Vgmcont and an output terminal of the control voltage Vslope for determining the exponential conversion characteristic are provided respectively.

The slave block (second exponential conversion circuit) 303 comprises a variable trans-conductance amplifier 307, a calculation amplifier (operation amplifier) 306, a current mirror circuits M306 and M307, and resistor devices R303 and R304.

The calculation amplifier 306 receives reference voltages Vcom1 and Vcom3, and outputs an output signal to the variable trans-conductance amplifier 307. The reference voltage Vcom3 is created with the resistor devices R303 and R304. A control voltage (control input signal) Vc, a conductance control signal Vgmcont and an output signal of the calculation amplifier 306 are input to the variable trans-conductance amplifier (Gm2) 307, An output signal of the variable trans-conductance amplifier 307 is input to the gate of the MOS transistor M303. A voltage between the gate and the source of the MOS transistor M303 is Vgs 303. Furthermore, when a current $I_{DM3}$ which flows through the MOS transistor M306 is set to n, the current ln(Icont) which flows through the MOS transistor M307 becomes 1/n with the current mirror circuit.

Then, this exponential conversion output current (gain control signal) ln(Icont) is output from the drain of the MOS transistor M307. Incidentally, in denotes a logarithm.

Incidentally, an input terminal of the common mode reference voltage Vcom1, an input terminal of the control voltage (control input signal) Vc, a conductance control signal (control voltage which determines the exponential conversion characteristic) Vgmcont, and an output terminal of the exponential conversion output current (gain control signal) ln(Icont) are provided at the slave block 303, respectively.

By the way, in the exponential conversion circuit, limiting a change in the gain with respect to the change in the control signal to a definite scope without being affected by the temperature change can be realized by maintaining the change ratio in the output signal ln(Icont) which linearly changes with respect to the control input signal Vc input to the exponential conversion circuit.

Here, when this exponential conversion characteristic is grasped as a linear function of the exponential conversion output ln(Icont), the exponential conversion circuit realizes primarily the following two circuit operations.

One operation is an operation which determines a piece of the exponential conversion characteristic while the other operation is an operation which sets to a definite level an inclination of the exponential conversion characteristic. Incidentally, such operation characteristic is represented in the first quadrant of an operation characteristic diagram of the exponential conversion circuit shown in FIG. 11.

An operation of the exponential conversion circuit of FIG. 11 is specifically conducted in the following manner.

In the beginning, when the reference input voltage Vref is input to the master block 302, an output current of the variable trans-conductance amplifier 305 flows through the resistor devices R301 and R302 so that the value of an output voltage Vo is determined. The output voltage Vo determines the gate voltage of the MOS transistors M301 and M302.

At the same time, since the reference current Iref which flows through the reference block 301 creates a common mode reference voltage Vcom1, this common mode reference voltage Vcom1 is input to the calculation amplifier 304 in the master block 302 and the calculation amplifier 306 in the slave block 303 respectively.

In the master block 302, an output voltage (control voltage) Vslope is determined on the basis of the output voltage Vo of the variable trans-conductance amplifier 305. Furthermore, the output voltage Vslope is fed back with the variable trans-conductance amplifier 305 as a control voltage (feedback signal) Vgmcont. The reference voltage (intermediate voltage) Vcom2 is determined with the output voltage Vo of the variable trans-conductance amplifier 305 and resistor devices R301 and R302.

Figure 12:
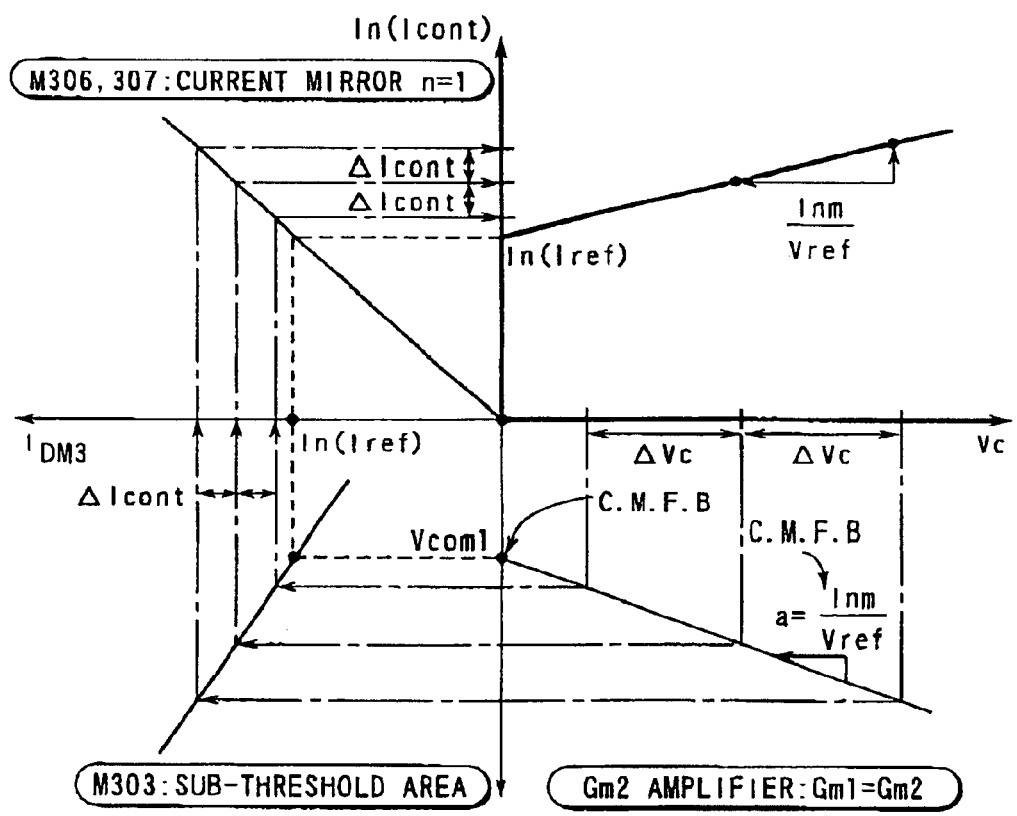
FIG. 12 is a diagram showing one example of an operation of an exponential conversion circuit according to the present invention.

A circuit associated with the feedback loop in the master block 302 realizes an operation of determining a cut piece ln(Iref) of FIG. 12.

Incidentally, the MOS transistor M300 in the reference block 301 is operated in the weak inversion area, and the following relation is shown.

$$I_{ref} = k\frac{W}{L}\exp\frac{V_{com1}}{nV_T} \quad (3)$$

Incidentally, in the expression (3), symbol Iref denotes a drain current of the MOS transistor M300. Symbol W denotes a channel width of the MOS transistor M300. Symbol L denotes a channel length of the MOS transistor M300. Symbol Vcom1 denotes an output voltage (common phase reference voltage) of the reference block 301. Symbol $V_T$ denotes a heat voltage. Symbol n denotes a constant. Furthermore, symbol k has a value associated with the conductance n of the MOS transistor M300, and the value depends upon the manufacturing process of the integrated circuit.

In the master block 302, the MOS transistors M301 and M302 for receiving an output signal of the variable trans-conductance amplifier 305 are operated in a weak inversion area, and the drain currents $I_{DM1}$ and $I_{DM2}$ which flows through the MOS transistors M301 and M302 are represented in the following Expressions (4) and (5).

$$I_{DM1} = K\frac{W}{L}\exp\frac{V_{gs301}}{nV_T} \quad (4)$$

$$I_{DM2} = K\frac{W}{L}\exp\frac{V_{gs302}}{nV_T} \quad (5)$$

At this time, the values of Vgs301 and Vgs302 are represented in the following expressions (6) and (7).

$$V_{gs301} = V_{com1} + G_{m1} \cdot R \cdot V_{ref} \quad (6)$$

$$V_{gs302} = V_{com1} - G_{m1} \cdot R \cdot V_{ref} \quad (7)$$

Incidentally, in the expressions (6) and (7), symbol R denotes resistance values (representing resistance values same as R301 and R302) of resistor devices R301 and R302. Symbol Gm1 denotes a conductance of the variable trans-conductance amplifier 305. Symbol Vref denotes an input voltage of the variable trans-conductance amplifier 305. Symbols Vgs 301 and Vgs 302 denote a voltage between the gate and the source of the MOS transistors M301 and M302 respectively.

Furthermore, with the current mirror circuit comprising MOS transistors M304 and M305, a ratio of the drain current $I_{DM1}$ of the MOS transistor M301 and the drain current $I_{DM2}$ of the MOS transistor M302 becomes m:1/m. When this is represented in a relation expression, the following expressions are provided.

$$\frac{I_{DM1}}{I_{DM2}} = \frac{m}{1/m} = m^2 \quad (8)$$

$$m^2 = \frac{I_{DM1}}{I_{DM2}} = \exp\frac{V_{gs301} - V_{gs302}}{nV_T} = \exp\frac{2Gm1 \cdot R \cdot V_{ref}}{nV_T} \quad (9)$$

Here, when a logarithm of both sides are taken in the expression (9), the following relation expression is provided.

$$\ln m^2 = \frac{2Gm1 \cdot R \cdot V_{ref}}{nV_T} \quad (10)$$

At this time, the exponential function current created by the MOS transistors M301 and M302 with respect to the reference input voltage Vref is determined with a size ratio of the MOS transistors M304 and M305 constituting the current mirror circuit so that Vslope is output from the master block 302.

This Vslope is input to the variable trans-conductance in the master block 302 again as Vgmcont (differential mode feedback). That is, the value of the conductance Gm1 of the variable conductance amplifier 305 is controlled with Vslope (or Vgmcont).

As a consequence, an inclination of the exponential conversion characteristic is determined with respect to the reference input voltage Vref. Furthermore, Vslope output from the master block 302 is also input to the variable trans-conductance amplifier 307 in the slave block 303 (differential mode feedback). That is, the value of the conductance Gm2 of the variable trans-conductance amplifier 307 is also controlled with Vslope (or Vgmcont).

In this manner, the control of the conductance Gm2 of the variable trans-conductance amplifier 307 in the slave block 303 becomes substantially the same as the control of the conductance Gm1 of the variable conductance amplifier 305.

The conductances Gm1 and Gm2 are represented in an expression in the following manner.

$$Gm1 = Gm2 = \frac{nV_T}{RV_{ref}} \ln m \quad (11)$$

Incidentally, a series of the above operation is represented in the fourth quadrant in FIG. 12.

That is, both conductances Gm1 and Gm2 are determined with the master block 301. Then, when the control voltage Vc is input to the variable trans-conductance amplifier 307, an output voltage Vc2 of the variable trans-conductance amplifier 307 is determined. The MOS transistor M303 receives Vc2, the MOS transistor M303 are operated in a weak inversion area in the same manner as the MOS transistors M301 and M302.

Then, a drain current $I_{DM3}$ of the MOS transistor M303 is represented in the following manner.

$$I_{DM3} = k\frac{W}{L}\exp\frac{V_{gs303}}{nV_T} \quad (12)$$

Here, Vgs303 can be modified in the following manner.

$$V_{gs303} = V_{com1} + G_{m2} \cdot R \cdot V_C \quad (13)$$

$$= V_{com1} + \left(\frac{nV_T}{2RV_{ref}} \ln m^2\right) RV_c$$

$$= V_{com1} + \left(\frac{nV_T}{2V_{ref}} \ln m^2\right) V_c$$

Incidentally, in the Expression (13), symbol R denotes resistance values of resistor devices R301 and R302 (it is supposed that both R301 and R302 have the same resistance values). Symbol Gm2 denotes a conductance of the variable conductance amplifier 307. Symbol Vcom1 denotes a reference voltage output from the reference block 301. Symbol Vgs303 denotes a voltage between the gate and the source of the MOS transistors M303, respectively.

Furthermore, a ratio of a drain current $I_{DM3}$ of the MOS transistor M303 and an output current (exponential conversion characteristic current) Icont of the slave block 303 becomes n:1/n with a current mirror circuit comprising MOS transistors M306 and M307.

Here, suppose that n is 1, Icont can be represented in the following manner.

$$I_{cont} = k\frac{W}{L}\exp\left(\frac{V_{gs303}}{nV_T}\right) \quad (14)$$

$$= k\frac{W}{L}\exp\left(\frac{V_{com1}}{nV_T}\right) \cdot \exp\left\{\frac{\left(\frac{nV_T}{2V_{ref}} \ln m^2\right)}{nV_T} V_c\right\}$$

At this time, the common mode reference voltage Vcom1 created with the reference block 301 is input to the calculation amplifier 304 in the master block 302, and is also input to the calculation amplifier 306 in the slave block 303. Symbol Vcom3 denotes a voltage (intermediate voltage) at a connection point of the resistor devices R303 and R304 determined in the common mode feedback.

Here, in the Expression (14), when the logarithm (ln) on both sides are taken, the following relation expression can be obtained.

$$\ln(I_{cont}) = \ln(I_{ref}) + \ln\left\{m\left(\frac{V_c}{V_{ref}}\right)\right\} \quad (15)$$

Incidentally, symbol m refers to m in a size ratio (m:1/m) of the MOS transistor in the master block 302.

From the above result, conductance Gm1(=Gm2) is determined with the master block 302. Furthermore, an inclination of the exponential conversion characteristic is determined by using the conductance Gm2 in the slave block 303. Furthermore, the common mode reference voltage Vcom1 is input to both the master block 302 and the slave block 303 to determine the piece of the exponential conversion characteristic.

Such an operation is represented in the third and the fourth quadrants of FIG. 12.

That is, an inclination of the exponential conversion characteristic which determines the variable scope of the exponential conversion circuit is determined with the size ratio (m:1/m) of the MOS transistor in the master block 302 and the reference input voltage Vref so that the inclination does not depend upon the characteristic change and the temperature change of the active device.

Hereinafter, there will be explained an embodiment of the variable gain amplifier (variable gain amplifier) using the exponential conversion circuit of FIG. 11.

Figure 13:
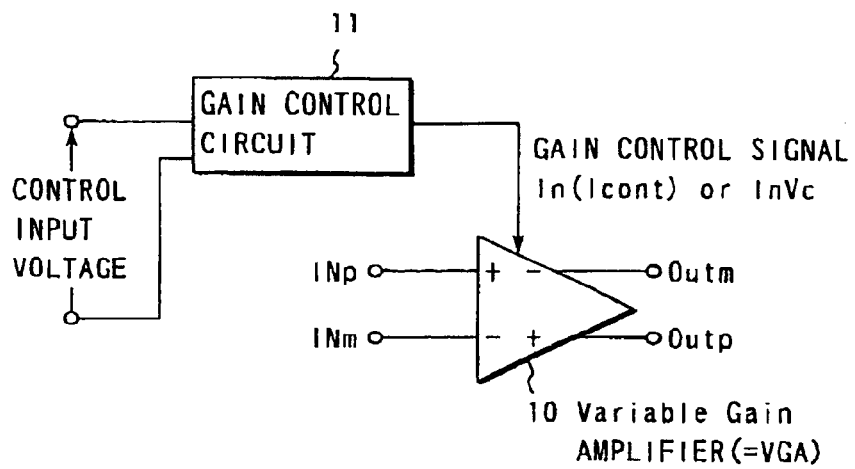
FIG. 13 is a diagram showing a first embodiment of a system comprising an exponential conversion circuit and a variable gain amplifier.
Figure 14:
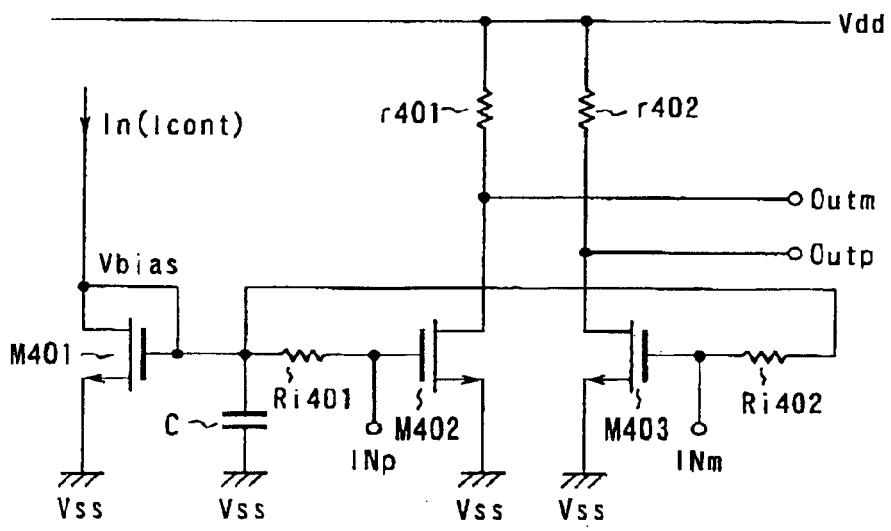
FIG. 14 is a diagram showing a concrete example of a variable gain amplifier.

FIG. 13 is a diagram showing a basic structure of a system using the variable gain amplifier according to the present invention. FIG. 14 is a diagram showing a concrete example of the variable gain amplifier 10 of FIG. 13.

As the gain control circuit 11, the exponential conversion circuit shown in FIG. 11 is used as it is. Furthermore, in this embodiment, the variable gain amplifier 10 comprises MOS transistors M401, M402 and M403, resistor devices Ri401, Ri402, r401, r402 and a capacitor C.

In this system, in the beginning, the control voltage Vc is input to the gain control circuit (exponential conversion circuit) 11. Furthermore, the gain control signal lnVc (or ln(Icont)) is created with the gain control circuit 11. On the other hand, in the variable gain control circuit 10, output signals Outp and Outm are created on the basis of the input signals INp and INm.

Here, since the gain control signal lnVc(or ln(Icont)) output from the gain control circuit 11 are input to the variable gain amplifier 10, the gain of the variable gain amplifier 10 changes on the basis of the gain control signal lnVc(or ln(Icont)). That is, when the bias voltage Vbias which is a gate voltage of the MOS transistors M402 and M403 is changed with the gain control signal lnVc(or ln(Icont)), the gain of the variable gain amplifier 10 can be freely changed.

Figure 15:
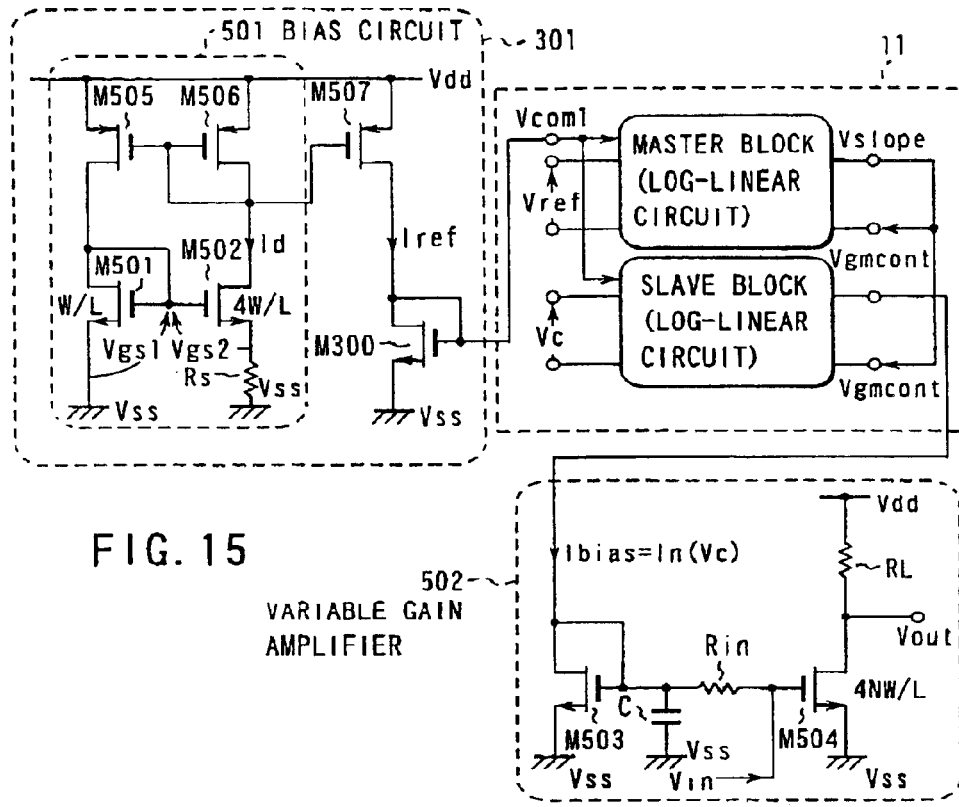
FIG. 15 is a diagram showing a second embodiment of a system comprising an exponential conversion circuit and a variable gain conversion circuit.

FIG. 15 is a diagram showing a basic structure of a system using a variable gain amplifier according to the present invention.

As the gain control circuit 11, the exponential conversion circuit shown in FIG. 11 can be used as it is. In this embodiment, for the sake of simplification of the explanation, the variable gain amplifier 502 is operated in a single input. The variable gain amplifier 502 comprises MOS transistors M503 and M504, resistor devices Rin and RL and a capacitor C. Symbol Vin denotes an input signal of the variable gain amplifier 502, an output signal of the variable gain amplifier, and the gain of the variable gain amplifier 502 is controlled with the variable gain control signal Ibias (InVc).

The reference block 301 comprises a bias circuit 501, and MOS transistors M507 and M300. Current Iref flows through the MOS transistor M300, and a drain voltage of the MOS transistor M300 is output as the reference voltage Vcom1.

The bias circuit 501 comprises MOS transistors M501, M502, M505 and M506 and a resistor device Rs. A size ratio (drive force ratio) between the MOS transistor M501 and the MOS transistor M502 is set to 1:4. Here, in the drawings, symbol W/L denotes a channel width/channel length.

By the way, in such a case, the size (drive force) of the MOS transistor M504 in the variable gain amplifier 502 is set to 4NW/L, the relation between the bias circuit 501 and the variable gain amplifier 502 is shown in the following expression (16).

$$A_v = 2\frac{RL}{Rs} \times N \quad (16)$$

Here, symbol Rs denotes a resistance value of the resistor device Rs in the bias circuit 501, symbol RL denotes a resistance value of the resistor device RL in the variable gain amplifier 502. Furthermore, symbol N denotes a value which is determined with a size ratio of the MOS transistor.

In this manner, when the gain control of the variable gain amplifier 502 is conducted by using the exponential conversion circuit of the present invention, the variable scope of the gain of the variable gain amplifier 502 and the gain characteristic thereof becomes hard to change with respect to the characteristic change and the temperature change of the MOS transistor.

Incidentally, in the variable gain amplifier 502 of FIG. 15, in the case where the MOS transistors M501 and M502 in the bias circuit 501 and the MOS transistors M503 and M504 in the variable gain amplifier 502 are operated in a strong inversion area, and the bias current Ibias of the variable gain amplifier 502 is changed in the scope of one to ten times with the gain control circuit (exponential conversion circuit) 11, the variable gain amplifier 502 can realize a gain change of 10 dB portion.

In contrast in the variable gain amplifier 502 of FIG. 15, the MOS transistors M501 and M502 in the bias circuit 501 and the MOS transistors M503 and M504 in the variable gain amplifier 502 are operated in a weak inversion area, respectively. Furthermore, in the case where the bias current Ibias of the variable gain amplifier 502 is changed by the gain control circuit (exponential conversion circuit) 11 in the scope of one to ten times, the variable gain amplifier 502 can realize a change in the gain of 20 dB portion.

Since the operation characteristic of the MOS transistor changes with the bias voltage (weak inversion area ←→ strong inversion area), it becomes difficult to realize a wide scope gain change with the gain control circuit in the case where only one variable gain amplifier 502 constitutes a system.

An embodiment will be explained to solve this problem.

Figure 16:
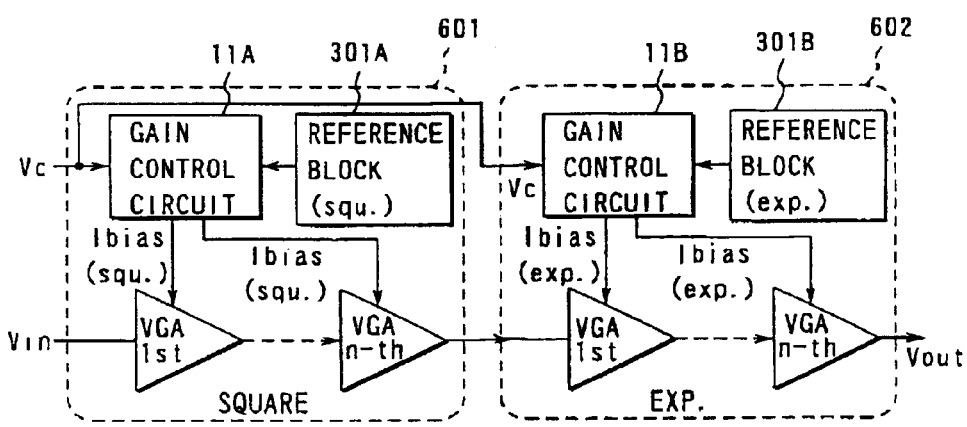
FIG. 16 is a diagram showing a third embodiment of a system comprising an exponential conversion circuit and a variable gain conversion circuit.

FIG. 16 is a diagram showing a basic structure of a system using a variable gain amplifier according to the present invention.

The characteristic of this system lies in that a plurality of variable gain amplifiers are connected in series, and a wide scope of gain change can be realized. As the gain control circuits 11A and 11B, the exponential conversion circuit shown in FIG. 11 is used as it is.

The gain of the former half of the plurality (two in this embodiment) of variable gain amplifiers VGA is controlled with the gain control signal Ibias created with the gain control circuit 11A and the reference block 301A. That is, in a portion surrounded by broken line 601, these variable gain amplifiers VGA are operated in a strong inversion area with the gain control circuit 11A and the reference block (bias circuit) 301A.

In contrast, the gain of the latter half of the plurality (three in this embodiment) of variable gain amplifiers VGA is controlled with the gain control circuit 11B and the gain control bias Ibias (exp.) created with the reference block 301B. That is, in a portion surrounded with the broken line 602, these variable gain amplifiers VGA are operated in a weak inversion area with the gain control circuit 11B and the reference block (bias circuit) 301B.

As a consequence, in a system comprising the gain control circuit (exponential conversion circuit) and the variable gain amplifier shown in FIG. 16, it becomes possible to realize a gain change for 80 dB portion. For example, this system can be applied to a variable gain amplifier of an IF stage of the CDMA method. Furthermore, various gain amplifiers can be constituted by changing a combination of an amplifier.

Additional advantages and modifications will readily occur to those skilled in the art. Therefore, the invention in its broader aspects is not limited to the specific details and representative embodiments shown and described herein. Accordingly, various modifications may be made without departing from the sprit or scope of the general inventive concept as defined by the appended clams and their equivalents.

What is claimed is:

1. An exponential conversion circuit comprising:

a first voltage conversion circuit for converting first and second reference voltages to first and second differential output voltages, respectively, on the basis of a first gain control signal;

a first exponential conversion device for creating a first output current which changes exponentially with respect to the first differential output voltage;

a second exponential conversion device for creating a second output current which changes exponentially with respect to the second differential output voltage;

a first current comparison circuit for changing the first gain control signal in accordance with the ratio of the first and second output currents;

a second voltage conversion circuit for converting a third reference input voltage and the first reference input voltage to third and fourth differential output voltages, respectively, on the basis of a second gain control signal;

a third exponential conversion device for creating a third output current which changes exponentially with respect to the third differential output voltage;

a fourth exponential conversion device for creating a fourth output current which changes exponentially with respect to the fourth differential output voltage;

a second current comparison circuit for changing the second gain control signal in accordance with the ratio of the third and fourth output currents;

a third voltage conversion circuit for converting the second reference input voltage and the third reference input voltage to fifth and sixth differential output voltages, respectively, on the basis of a third gain control signal;

a voltage comparison circuit for creating the third gain control signal in accordance with the ratio of the fifth or sixth differential output voltage as against the second gain control signal;

a fourth voltage conversion circuit for converting a control input voltage and the first reference input voltage to seventh and eighth differential output voltages, respectively, on the basis of the third gain control signal;

a fifth voltage conversion circuit for converting the control input voltage and the first reference input voltage to a ninth differential output voltage on the basis of a fourth gain control signal; and a fifth exponential conversion device for creating a fifth output current which changes exponentially with respect to the ninth differential output voltage;

wherein one of the seventh and eighth differential output voltages becomes the fourth gain control signal to change the fifth output current exponentially with respect to the control input voltage.

2. The exponential conversion circuit according to claim 1, wherein the first, second, third and fourth voltage conversion circuits have a common mode detection circuit and a common mode feedback circuit.

3. The exponential conversion circuit according to claim 2, wherein the first gain control signal is input to the common mode feedback circuit in the third and fourth voltage conversion circuits.

4. The exponential conversion circuit according to claim 1, wherein the first, second, third, fourth and fifth exponential conversion devices comprise electric field effect transistors which are operated in a weak inversion area.

5. The exponential conversion circuit according to claim 1, wherein the first, second, third, fourth, and fifth exponential conversion devices comprise, bipolar transistors.

6. A variable gain circuit comprising:

an exponential conversion circuit comprising:

a first voltage conversion circuit for converting first and second reference voltages to first and second differential output voltages, respectively, on the basis of a first gain control signal;

a first exponential conversion device for creating a first output current which changes exponentially with respect to the first differential output voltage;

a second exponential conversion device for creating a second output current which changes exponentially with respect to the second differential output voltage;

a first current comparison circuit for changing the first gain control signal in accordance with the ratio of the first and second output currents;

a second voltage conversion circuit for converting a third reference input voltage and the first reference input voltage to third and fourth differential output voltages, respectively, on the basis of a second gain control signal;

a third exponential conversion device for creating a third output current which changes exponentially with respect to the third differential output voltage;

a fourth exponential conversion device for creating a fourth output current which changes exponentially with respect to the fourth differential output voltage;

a second current comparison circuit for changing the second gain control signal in accordance with the ratio of the third and fourth output currents;

a third voltage conversion circuit for converting the second reference input voltage and the third reference input voltage to fifth and sixth differential output voltages, respectively, on the basis of a third gain control signal;

a voltage comparison circuit for creating the third gain control signal in accordance with the ratio of the fifth or sixth differential output voltage as against the second gain control signal;

a fourth voltage conversion circuit for converting a control input voltage and the first reference input voltage to seventh and eighth differential output voltages, respectively, on the basis of the third gain control signal;

a fifth voltage conversion circuit for converting the control input voltage and the first reference input voltage to a ninth differential output voltage on the basis of a fourth gain control signal; and a fifth exponential conversion device for creating a fifth output current which changes exponentially with respect to the ninth differential output voltage;

wherein one of the seventh and eighth differential output voltages becomes the fourth gain control signal to change the fifth output current exponentially with respect to the control input voltage; and a plurality of variable gain amplifiers connected in series wherein a gain of each of the plurality of variable gain amplifiers is controlled with the fifth output current of the exponential conversion circuit.

* * * * *